(12) United States Patent
Peterson (10) Patent No.: US 8,587,322 B2
(45) Date of Patent: Nov. 19, 2013

(54) METHODS AND APPARATUS FOR MOTOR EMULATION

(75) Inventor: William A. Peterson, Vestal, NY (US)

(73) Assignee: E & M Power, Inc., Binghamton, NY (US)

( * ) Notice: Subject to any disclaimer, the term of this patent is extended or adjusted under 35 U.S.C. 154(b) by 558 days.

(21) Appl. No.: 12/913,196

(22) Filed: Oct. 27, 2010

(65) Prior Publication Data
US 2012/0105072 A1 May 3, 2012

(51) Int. Cl.
*G01R 31/14* (2006.01)
*G01R 31/28* (2006.01)

(52) U.S. Cl.
USPC ........................................................ 324/511

(58) Field of Classification Search
None
See application file for complete search history.

(56) References Cited

U.S. PATENT DOCUMENTS

| | | | |
|---|---|---|---|
| 5,721,879 A * | 2/1998 | Harada et al. | 703/23 |
| 7,391,181 B2 | 6/2008 | Welchko et al. | |
| 7,679,310 B2 | 3/2010 | Schulz et al. | |
| 2004/0036459 A1* | 2/2004 | Wiktor et al. | 323/282 |

OTHER PUBLICATIONS

Product Information ScienLab, pp. 1-2, Jan. 2010.
Y. Srinivasa Rao and Mukul C. Chandorkar, "Real-Time Electrical Load Emulator Using Optimal Feedback Control Technique" IEEE Transactions on Industrial Electronics, vol. 57, No. 4, Apr. 2010.

* cited by examiner

*Primary Examiner* — Jermele M Hollington
(74) *Attorney, Agent, or Firm* — Matthew B. Dernier, Esq.; Gibson & Dernier LLP (57) ABSTRACT

Methods and apparatus provide for: a first DC bus operating to support a first DC voltage potential and for connecting to a DC input of a motor driver inverter circuit; a motor emulator circuit operating to emulate a polyphase motor and including polyphase output terminals for connecting to a polyphase output of the motor driver inverter circuit; a second DC bus operating to support a second DC voltage potential to a DC input of the motor emulator circuit; and a bi-directional DC-DC power supply coupled between the first and second DC busses, and operating to both: (i) add voltage potential to the first DC voltage potential to produce the higher, second DC voltage potential on the second DC bus, and (ii) subtract voltage potential from the second DC voltage potential to produce the lower, first DC voltage potential on the first DC bus.

18 Claims, 9 Drawing Sheets

FIG. 6C

METHODS AND APPARATUS FOR MOTOR EMULATION

BACKGROUND OF THE INVENTION

The present invention relates to methods and apparatus for accurately and efficiently emulating a polyphase machine, such as a three-phase machine, e.g., a motor/generator, in order to load a motor drive inverter.

Polyphase motors, such as permanent magnet, synchronous machines must be driven such that the windings thereof are energized as a function of the rotor position in order to obtain a driving torque from the machine. The windings of the polyphase motor are typically driven utilizing a motor driver inverter (inverter), which receives a direct current (DC) source of voltage and produces an alternating current (AC) source of voltage for driving the polyphase motor.

Development and testing of motor drive inverters is usually accomplished using a motoring dynamometer. For four quadrant operation, the dynamometer operates as a motor/generator and the power applied to, or taken from, the dynamometer is normally dissipated as heat. There are some systems in which the power applied to, or taken from, the dynamometer is recirculated back to the MAINS.

As an alternative to testing a motor drive inverter using a motoring dynamometer, systems have been developed in which a load inverter is used to emulate a three-phase machine (thereby emulating the characteristics of a motoring dynamometer). A motor emulator is desirable as an alternative to the dynamometer testing approach because one may test the motor drive inverter without moving parts, and if the motor emulator is properly designed, heat loss may be significantly minimized. A motor emulator inverter should accurately mimic the dynamic characteristics of a three-phase machine, at least to the extent that adequate testing of the motor drive inverter is achieved. Thus, the motor emulator should mimic the three phase back-electro-motive-force (BEMF) characteristics of a physical motor, and should operate in multiple quadrants, preferably all four quadrants of the torque versus speed curve.

Figure 1:
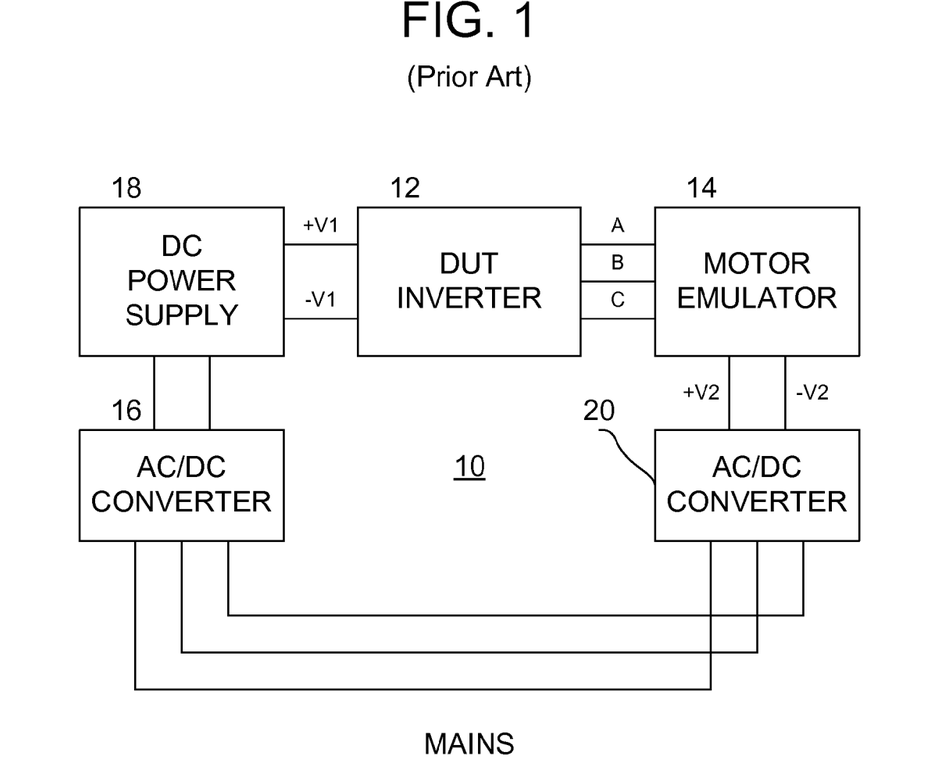
FIG. 1 is a block diagram of a prior art system for loading a motor drive inverter (under test) with an inverter for emulating a three-phase motor/generator.

Reference is made to FIG. 1, which illustrates a conventional system 10 for testing a motor drive inverter 12 (the device under test, DUT) using a motor emulator inverter 14. The system 10 operates from a three-phase source of AC power, the MAINS.

On the input side of the DUT inverter 12, the system 10 includes an AC/DC converter 16 and a DC power supply 18. The combination of the AC/DC converter 16 and the DC power supply 18 provides a bi-directional source/sink for power to/from the DUT inverter 12. For example, the potential between the +/−V1 nodes of the DC power supply 18 may be on the order of about 300 VDC. Although one skilled in the art will appreciate that the DC power supply 18 would appear to be redundant (indeed, the AC/DC converter produces DC power), the DC power supply 18 is sometimes identified as a functionally distinct circuit because it may provide battery emulation (exhibiting the time-variant charge characteristics of a physical battery).

On the output side of the DUT inverter 12, the system 10 includes the motor emulator 14 (coupled to the DUT inverter via three-phase connection) and an AC/DC converter 20. The AC/DC converter 20 provides a bi-directional source/sink for power to/from the motor emulator 14. For example, the potential between the +/−V2 nodes of the DC power supply 20 may be on the order of about 400 VDC. Note that in this example, the +/−V2 magnitude is higher than the +/−V1 magnitude. This is so to permit the motor emulator inverter 14 to operate as a motor/generator when the DUT is at or near modulation indices of 1.0. Here the motor emulation inverter must source current at voltages that are higher than the terminal voltages of the DUT inverter 12. Obviously, at lower modulation indices, where the DUT inverter 12 is producing relatively lower terminal voltages, the +/−V2 magnitude may be less than or equal to the +/−V1 magnitude.

Generally speaking, when the DUT inverter 12 is sourcing power, the AC/DC converter 16 and the DC power supply 18 source power from the MAINS to the DUT inverter 12, the motor emulator 14 operates as a motor, and the AC/DC converter 20 sinks power from the motor emulator 14 to the MAINS. Conversely, when the DUT inverter 12 is sinking power, the AC/DC converter 20 sources power from the MAINS to the motor emulator 14, the motor emulator 14 operates as a generator, and the AC/DC converter 16 and the DC power supply 18 sink power from the DUT inverter 12 to the MAINS.

Thus, the system 10 permits the recirculation of current during testing, which is an advantageous way of testing the DUT inverter 12 because relatively low amounts of power are lost through heat dissipation (as compared to motoring dynamometer systems). Among the significant disadvantages of the system 10, however, is that fact that all of the converters (i.e., the AC/DC converter 16, the DC power supply 18, and the AC/DC converter 20) must be rated at full power (with reference to rated power of the DUT inverter and/or the motor emulator 14). This is so because the system 10 recirculates current through the MAINS. Thus, for example, if the DUT inverter 12 is to be tested at 100 KW, then all of the converters in the system must be rated for at least 100 KW operation. Such full power rating requires significant component and circuit costs and also contributes to higher heat losses in the system.

Figure 2:
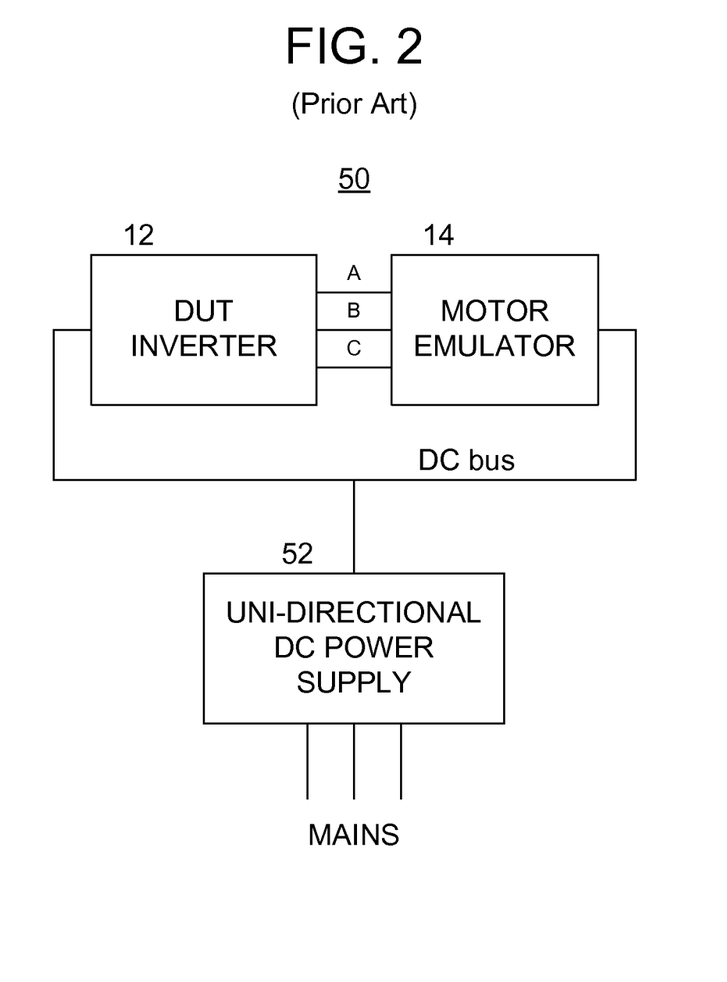
FIG. 2 is a block diagram of an alternative prior art system for loading a motor drive inverter with a motor emulator.

Reference is now made to FIG. 2, which illustrates an alternative system 50 for testing the motor drive inverter 12 using the motor emulator inverter 14. Instead of employing separate, bi-directional DC converters (as was the case in the system of FIG. 1), the system 50 couples the respective DC sides of the DUT inverter 12 and the motor emulator 14 together. This configuration permits current recirculation without going back through the MAINS. Thus, when the DUT inverter 12 is sourcing power, the motor emulator 14 operates as a motor and recirculates current back to the DUT inverter 12. Conversely, when the DUT inverter 12 is sinking power, the motor emulator 14 operates as a generator, and the DUT inverter 12 sources current to the motor emulator 14.

The advantage of recirculating current locally, over the DC bus (as opposed to through the MAINS), is that the separate, full rated converters on each side of the DUT-emulator are not required. This reduces costs and improves efficiency. Indeed, the system 50 employs a uni-directional DC power supply 52, which only sources power in order to make up for any losses in the DUT inverter 12 and the motor emulator 14. Thus, the uni-directional DC power supply 52 need not be rated for full power (e.g., 100 KW), and could probably be rated for about 10% of full power.

The motor emulator 14 of the system 50 has been found to exhibit improved operation when it has the ability of sense when the switching transistors of the DUT inverter 12 are going to transition from state to state, without relying solely on sensing the output current of the DUT inverter 12. Sensing the commutation of the switching transistors of the DUT inverter 12 has been achieved using: (i) a set of common mode inductors coupled in series with a set of differential mode inductors; and (ii) a set of integrating capacitors, arranged in a Y configuration from respective junctions of the series coupled windings of the common mode and differential mode inductors. A Z-axis voltage sense, which is an emulation of the common mode voltage of the DUT inverter 12, is obtained at the common node of the Y configuration of capacitors. Such common mode voltage is thus available to the motor emulator 14 control circuitry, which provides information as to switch commutation within the DUT inverter 12.

The system 50 is not without disadvantages. The system 50 exhibits a relatively significant problem at modulation indices at or near 1.0. Indeed, since the same DC bus supplies both the DUT inverter 12 and the motor emulator 14, there is a limit to the modulation index at which the DUT inverter 12 may be tested. Indeed, if the DUT inverter 12 operates beyond such modulation index threshold, then the motor emulator 14 will not be able to source current to the DUT inverter 12 at voltage magnitudes that exceed the terminal voltages of the DUT inverter 12.

Depending on the PWM technique employed by the DUT inverter 12, the system 50 may exhibit a related problem at all modulation indices. This related problem will surface when, for example, the DUT inverter 12 employs a so-called discontinuous PWM switching technique. Consider, by way of example, a discontinuous PWM inverter employing a full, three-phase bridge of six switching transistors. In such an inverter, one of the six switching transistors will be continuously ON for a given 60 degrees of the output frequency of the inverter, with the remaining switching transistors being modulated via PWM to achieve the desired AC voltage and current profiles on all phase lines. In a next 60 degree interval, a different one of the switching transistors will be ON, and so forth. Since one transistor is continuously ON during a given 60 degree interval (irrespective of the modulation index), the motor emulator 14 must be capable of producing a higher magnitude voltage on the same phase line associated with the ON transistor, otherwise, there would be no way for the motor emulator 14 to control the current on that line.

Accordingly, there are needs in the art for new methods and apparatus for loading a motor drive inverter with an inverter for emulating a polyphase machine, e.g., a motor/generator.

SUMMARY OF THE INVENTION

In accordance with one or more aspects of the present invention, methods and apparatus provide for: a first DC bus operating to support a first DC voltage potential and for connecting to a DC input of a motor driver inverter circuit; a motor emulator circuit operating to emulate a polyphase motor and including polyphase output terminals for connecting to a polyphase output of the motor driver inverter circuit; a second DC bus operating to support a second DC voltage potential to a DC input of the motor emulator circuit; and a bi-directional DC-DC power supply coupled between the first and second DC busses, and operating to both: (i) add voltage potential to the first DC voltage potential to produce the higher, second DC voltage potential on the second DC bus; and (ii) subtract voltage potential from the second DC voltage potential to produce the lower, first DC voltage potential on the first DC bus.

Other aspects, features, and advantages of the present invention will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the invention is not limited to the precise arrangements and instrumentalities shown.

DETAILED DESCRIPTION OF THE PREFERRED EMBODIMENTS

Figure 3:
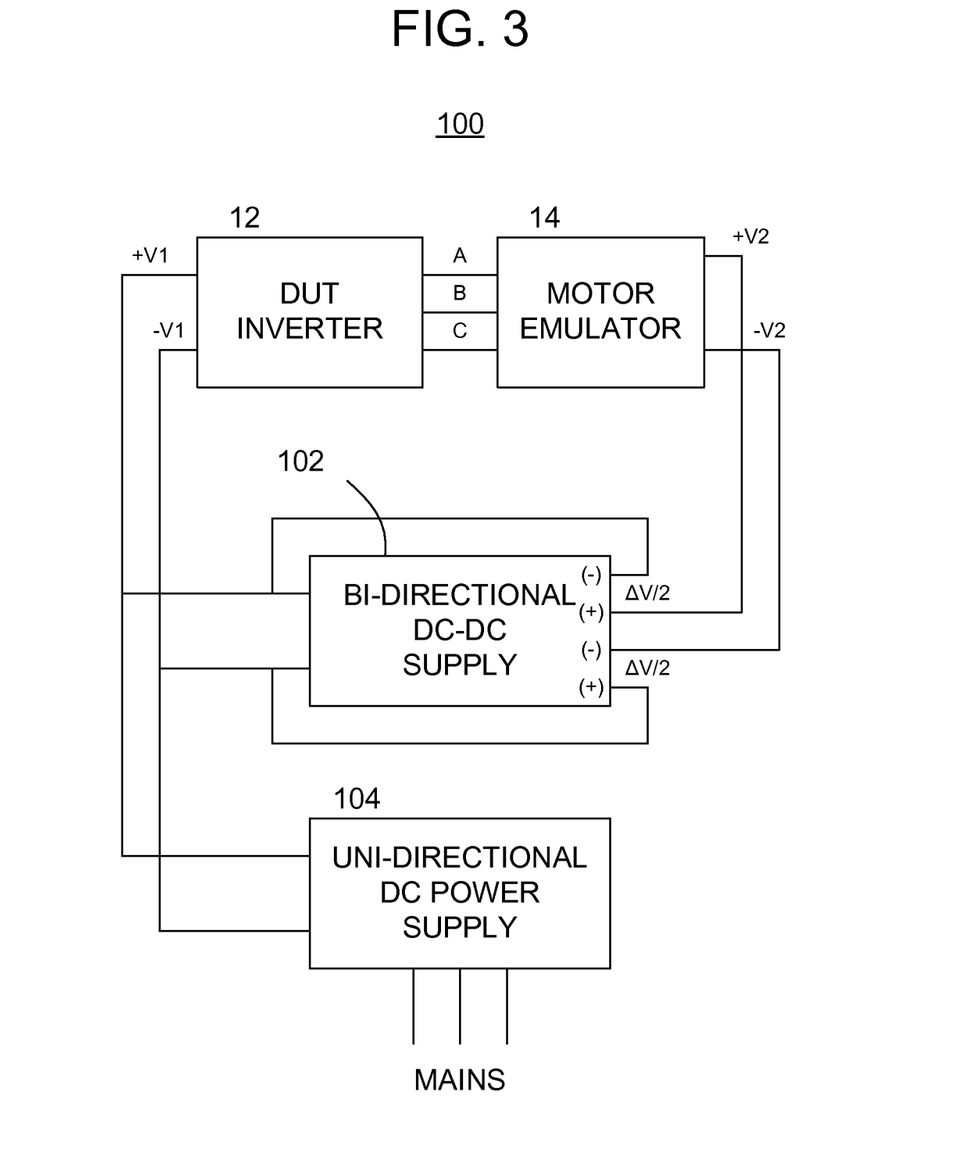
FIG. 3 is a block diagram of a system for loading a motor drive inverter (under test) with an inverter for emulating a polyphase motor/generator in accordance with one or more embodiments of the present invention.

With reference to the drawings wherein like numerals indicate like elements, there is shown in FIG. 3 a block diagram of a system 100 for loading a motor drive inverter (device under test, DUT) 12 with an inverter for emulating a polyphase motor/generator (motor emulator) 14 in accordance with one or more embodiments of the present invention. For purposes of discussion, they embodiments herein are shown and described as being implemented in a three-phase system; however, those skilled in the art will appreciate that the invention is not limited to three-phase systems, and indeed may be applied in other polyphase systems, such as five-phase, seven-phase, etc.

For the purposes of brevity and clarity, the block diagram of FIG. 3 (and other diagrams herein) will be referred to, and described herein, as illustrating an apparatus, it being understood, however, that the description may be readily applied to various aspects of one or more methods of the present invention with equal force.

The DUT inverter 12 is operable to receive DC voltage and current from a first DC bus, and to produce three-phase AC voltages and currents (over nodes A, B, C) to a motor emulator circuit 14. The motor emulator circuit 14 operates to emulate the characteristics of a three-phase motor in order to test and/or load the DUT inverter 12. The motor emulator circuit 14 receives DC voltage and current from a second DC bus and produces three-phase AC voltages and currents (over nodes A, B, C) to mimic the three phase back-electro-motive-force (BEMF) characteristics, the current characteristics, and the impedance characteristics of a physical motor. The motor emulator circuit preferably operates in multiple quadrants, preferably all four quadrants of the torque versus speed curve.

It is noted that the prior art is replete with various implementations of motor drive inverters 12 and motor emulators 14, and thus, for brevity and clarity, the specific details of particular designs for each of these elements are not provided herein. It is further noted that the motor emulator 14 may mimic any type of motor, such as a polyphase AC motor, a permanent magnet (PM) machine, a brushless DC motor, an induction machine, etc. It is understood that skilled artisans can easily apply the details of these illustrative embodiments in connection with any type of emulated machine in order to test and/or load any type of DUT inverter.

The first DC bus operates to support a first DC voltage potential between nodes +V1 and −V1. By way of example, the voltage on each of nodes +V1 and −V1 may exhibit the same magnitude with respect to a common reference potential, such as ground or neutral. While any suitable voltage magnitudes may be employed, +V1=150 VDC and −V1=−150 VDC are known to work well. The second DC bus operates to support a second DC voltage potential between nodes +V2 and −V2. Similar to the first DC bus, the voltage on each of nodes +V2 and −V2 may exhibit the same magnitude with respect to the common reference potential. While any suitable voltage magnitudes may be employed, such magnitudes of nodes +V2 and −V2 are preferably greater than the magnitudes of nodes +V1 and −V1. This will ensure that the motor emulator 14 is capable of presenting a suitably high voltage on any of the phase nodes A, B, C, and controlling the current into and out of such nodes to properly load the DUT inverter 12. By way of example, the respective voltage magnitudes on nodes +V2 and −V2 may be somewhere between about 5-10% higher than the magnitudes of nodes +V1 and −V1. Thus, +V2=165 VDC and −V2=−165 VDC should work well when +V1=150 VDC and −V1=−150 VDC.

The system 100 also includes a bi-directional DC-DC power supply 102 coupled between the first and second DC busses. The bi-directional DC-DC supply 102 ensures that the voltage magnitudes of nodes +V2 and −V2 are greater than the magnitudes of nodes +V1 and −V1. At the same time, the bi-directional DC-DC power supply 102 permits currents to recirculate between the first and second DC busses without the need to flow through a main source of power, such as the MAINS. As will be discussed in further detail below, this local recirculation of current results in significant advantage over the prior art.

In order to attain the desired voltage magnitudes on the first and second DC busses, the bi-directional DC-DC supply 102 operates to both: (i) add voltage potential (ΔV) to the voltage potential of the first DC bus to produce the higher, second DC voltage potential on the second DC bus, and (ii) subtract voltage potential (ΔV) from the voltage potential of the second DC bus to produce the lower voltage potential on the first DC bus. As illustrated, the bi-directional DC-DC supply 102 adds a positive voltage potential (+ΔV/2) to the positive node +V1 to produce the voltage on the positive node +V2, and adds a negative voltage potential (−ΔV/2) to the negative node −V1 to produce the voltage on the negative node −V2. Further details as to a particular embodiment of the bi-directional DC-DC supply 102 will be provided later in this description.

As mentioned above, the arrangement of the DUT inverter 12, the motor emulator 14, and the bi-directional DC-DC supply 102 permits local recirculation of current as the DUT inverter 12 and the motor emulator 14 operate in the various quadrants of the torque versus speed curve. Since each of the converters (i.e., the DUT inverter 12, the motor emulator 14, and the bi-directional DC-DC supply 102) is not 100% efficient, there will be some heat losses, which must be accounted for in order to have a functioning system 100. Accordingly, the system 100 includes a further DC power supply 104 coupled between a main source of power (in this example the MAINS) and the first DC bus. The DC power supply 104 operates to produce voltage at the first DC voltage potential and to control the voltage on that bus. The further DC power supply 104 provides power to offset the power conversion losses in the DUT inverter 12, the motor emulator 14, and the bi-directional DC-DC supply 102. Since the DC power supply 104 is essentially only making up for heat losses in power conversion, and all current recirculation is local, it need only be a uni-directional source of power to the first DC bus.

In this configuration, the further DC power supply 104 may emulate a battery to the DUT inverter 12 (which is often a realistic operating condition for the DUT inverter 12). Even though the further DC power supply 104 is not sourcing or sinking all of the current on the first DC bus, it operates to adjust its terminal output voltage to account for the full current in a manner that emulates a battery. Since, as will be discussed below, the bi-directional DC-DC supply 102 is not designed to regulate the voltage between +/−V1, or between +/−V2, the voltage between +/−V2 will exhibit more variation, which is acceptable to operate the motor emulator 14.

The recirculation and efficiency loss issues will be more readily understood by way of a concrete example. For purposes of such example, the following assumptions are made: (i) the DUT inverter 12 is tested at a full power rating of 200 KW; (ii) the first DC bus supports a 300 VDC potential, with +V1 =+150 VDC and −V1=−150 VDC; (iii) all power converters are 95% efficient in converting power from input to output; and (iv) the bi-directional DC-DC supply 102 adds +/−15 VDC to the +/−V1 nodes to produce 330 VDC on the second DC bus, such that +V2 =+165 VDC and −V2=−165 VDC. As a result of the above conditions, the motor emulator 14 will establish its characteristics to load the DUT inverter 12 in such a way that it delivers 200 KW thereto over phase nodes A, B, C. The DUT inverter 12 will draw 200÷0.95=210 KW from the first DC bus to produce such output power. The motor emulator 14 will convert the 200 KW received over nodes A, B, C into 200×0.95=190 KW of power on the second DC bus, which produces 190,000÷330=576 amperes of DC current on the second DC bus. The bi-directional DC-DC supply 102 recirculates the 576 amperes of current by producing 30 VDC×576=17.28 KW of power, of which 17,280×0.05=864 W will be dissipated as a heat loss. Thus, the bi-directional DC-DC supply 102 recirculates 190,000−864=189.136 KW back to the first DC bus. The difference between the power needed by the DUT inverter 12 (210 KW) and the power recirculated by the bi-directional DC-DC supply 102 (189.136 KW) is 20.864 KW. The DC power supply 104 produces the 20.864 KW of power and delivers same to the first DC bus, by drawing 20.864÷0.95=21.962 KW from the MAINS.

While the above example assumed that the 200 KW of power was being delivered from the DUT inverter 12 to the motor emulator 14; however, those skilled in the art will understand from the discussion thus far that a similar analysis may be performed with the motor emulator 14 operating as a generator (e.g., to simulate the regenerative breaking phenomenon of a physical electromechanical machine) and the DUT inverter 12 recirculating current into the first DC bus.

Notably, in the example discussed above, the total losses in the system 100 are 21.962 KW. If one were to compute the total loss of the system 10 of FIG. 1 (with similar operating assumptions), the loss is 40.5 KW. Thus, the system 100 is at least twice as efficient as the system 10 of the prior art. Further, the system 100 does not exhibit the problems that the system 50 of FIG. 2 exhibits at modulation indices at or near 1.0, or at all modulation indices when the DUT inverter 12 operates using the discontinuous PWM switching technique. This is so because the bi-directional DC-DC supply 102 ensures that the second DC bus operates at a higher potential than the first DC bus, no matter which way current is being circulated.

The system 100 includes still further advantages over the prior art. For example, recall that in the system 10 of FIG. 1, all of the converters (i.e., the AC/DC converter 16, the DC power supply 18, and the AC/DC converter 20) must be rated at full power. This is so because the system 10 recirculates current through the MAINS, not locally. Such full power rating requires significant component and circuit costs and also contributes to higher heat losses in the system. In contrast, the bi-directional DC-DC supply 102 and the DC power supply 104 need only be rated at a fraction of the full power ratings of the DUT inverter 12 and/or the motor emulator 14.

Typically, the bi-directional DC-DC power supply 102 may be rated at less than about 50% of the power rating of the motor emulator circuit, more specifically at some fraction computed as a function of the difference in voltage magnitude between the first and second DC busses. Thus, the bi-directional DC-DC power supply 102 may be rated at 100×ΔV÷(+V1−−V1) percent of a power rating of the DUT inverter 12 and/or the motor emulator circuit 14. In the example above, it was assumed that the bi-directional DC-DC power supply 102 augmented the voltage of the first DC bus by ΔV =30 VDC and the voltage of the first DC bus was 300 VDC. Thus, under these circumstances, the bi-directional DC-DC power supply is rated at about 10% of the power rating of the DUT inverter 12 and/or the motor emulator circuit 14. The same is true of the DC power supply 104.

Figure 4:
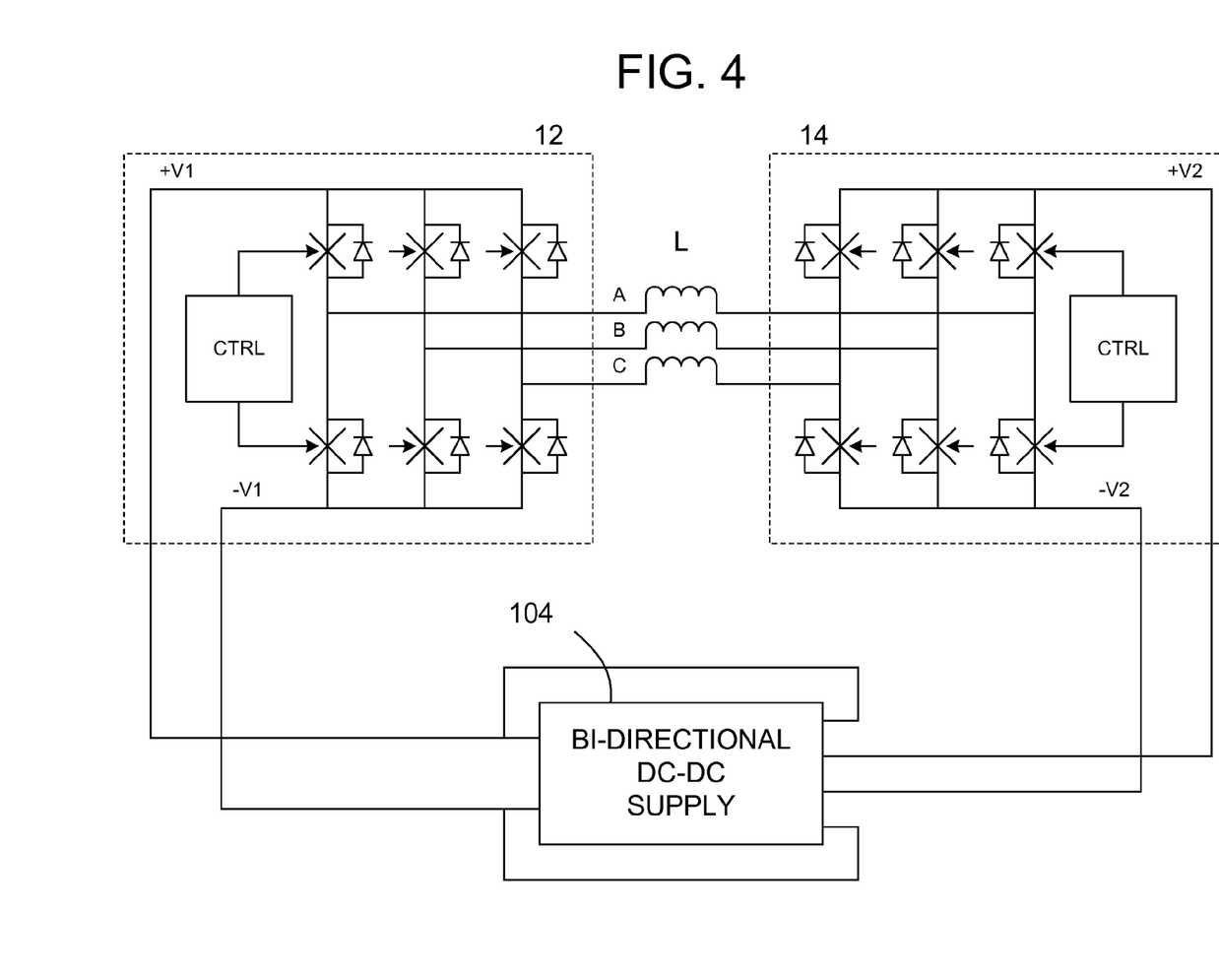
FIG. 4 is a more detailed block diagram of certain portions of the system of FIG. 3.

Reference is now made to FIG. 4, which illustrates some further details of the DUT inverter 12 and the motor emulator 14 as such relates to the overall system 100. The inverter driver circuit 12 may include a plurality of electronic switches that are operable to convert the DC voltage provided by the first DC bus (+/−V1) into AC voltage for delivery to the phase nodes A, B, C. For example, the DUT inverter 12 may include respective pairs of high-side and low-side electronic switches (e.g., IGBTs, MOSFETs, etc.), each with an anti-parallel diode thereacross, in a full bridge configuration. The respective pairs of switches are coupled in series across the first DC bus, and are coupled at respective intermediate nodes to the phase nodes A, B, and C. The motor emulator 14 includes a similar full bridge configuration of electronic switches, where respective intermediate nodes of the switches are coupled to the phase nodes A, B, C through a series inductance L. The inductance L includes at least one series inductor for each phase in order to mimic the inductance of a physical machine.

The respective electronic switches of the DUT inverter are turned on and off in accordance with driver control signals issuing from the control circuit, CTRL. More particularly, the control circuit is operable to provide the driver signals in order to commutate the electronic switches in order to produce three-phase AC voltage and current suitable for driving an electric motor. As discussed above, such driver signals are preferably in accordance with an appropriate PWM technique and may be a discontinuous PWM technique if desired. The commutation of the switches will usually involve some circuitry (not shown) for receiving information concerning the rotor position of the load (when the load is an actual, physical motor). In many cases, such rotor information will be obtained by way of sensorless techniques, such as by monitoring the "winding signals" on nodes A, B, C. Any of the known techniques for monitoring such signals may be employed, for example, monitoring BEMF voltages, monitoring current levels in the windings, etc. The control circuit CTRL will utilize the rotor information and other circuitry, such as error amplifiers, loop compensation circuitry, speed commands, torque commands, current sensing circuitry, etc. Such control techniques are well known in the art.

Figure 5:
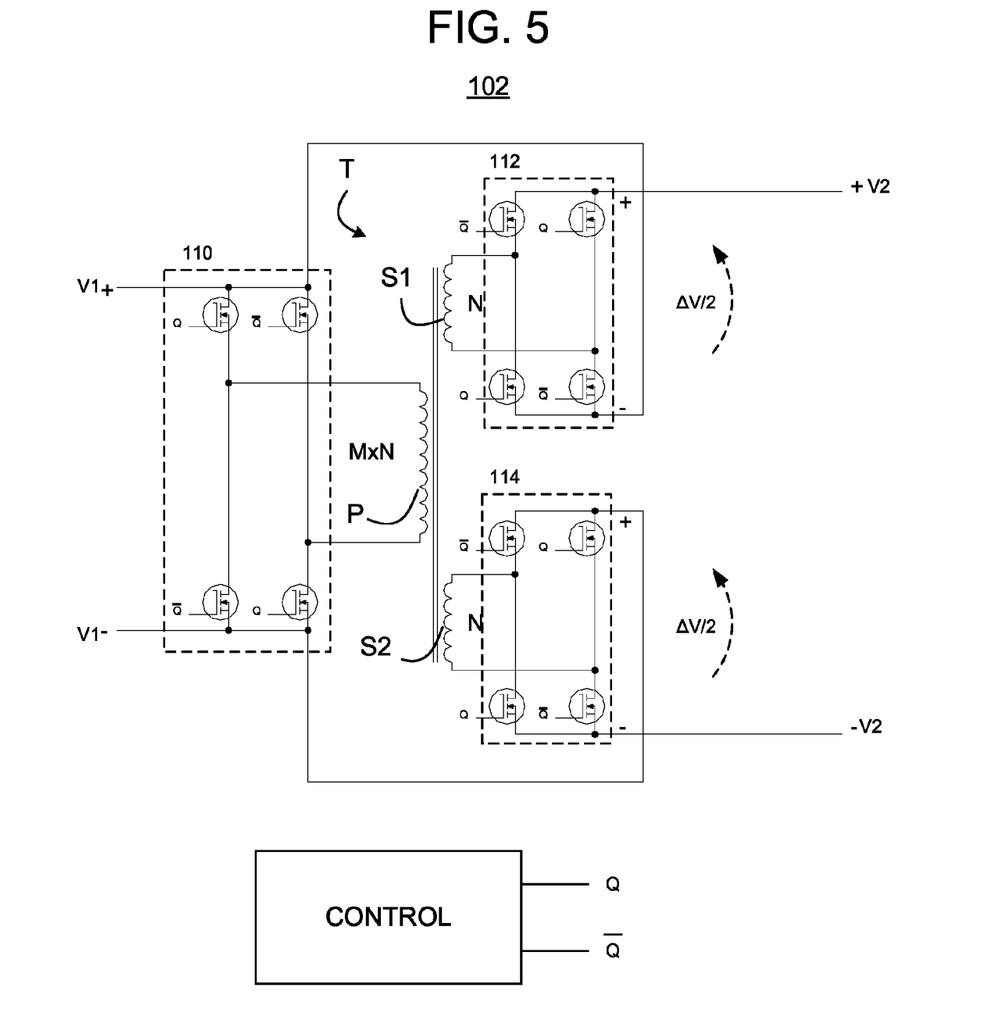
FIG. 5 is a block diagram of one implementation of the bi-direction DC-DC supply of the system of FIG. 3.

Reference is now made to FIG. 5, which illustrates a block diagram of a suitable implementation of the bi-directional DC-DC supply 102. In general, the bi-directional DC-DC power supply 102 includes a DC autotransformer circuit to produce +V1, −V1, +ΔV/2, −ΔV/2, −V2, and +V2. The DC autotransformer circuit includes a multi-winding transformer T, a plurality of switching transistors, and a control circuit, labeled CONTROL.

The transformer T includes a primary winding (P) of M×N turns, a first secondary winding (S1) of N turns, and a second secondary winding (S2) of N turns, where N and M×N are integers. By way of example, when one desires the voltage of the second DC bus (+/−V2) to be about 10% higher than the voltage of the first DC bus (+/−V1), then M may be 20 and N may be 1.

The DC autotransformer circuit further includes a primary switching transistor circuit 110 operating to couple the primary winding P of the transformer T to the positive and negative nodes of the first DC bus (+/−V1). The transistor switches are arranged in a full bridge configuration, where two respective pairs of high-side and low-side electronic switches, each with an anti-parallel diode thereacross, are coupled across the +/−V1 nodes. The respective intermediate nodes of each pair of switches are coupled to each end of the primary side winding P.

The DC autotransformer circuit still further includes a first, secondary switching transistor circuit 112 operating to couple the first secondary winding S1 of the transformer T to the positive node +V1 of the first DC bus and to the positive node +V2 of the second DC bus. The transistor switches 112 are again arranged in a full bridge configuration, where two respective pairs of high-side and low-side electronic switches, each with an anti-parallel diode thereacross, are coupled across the +V1, +V2 nodes. The respective intermediate nodes of each pair of switches are coupled to each end of the first secondary side winding S1. The additional voltage ΔV/2 is produced across the full bridge switching circuit 112, and thus +V2=+V1+ΔV/2.

The DC autotransformer circuit also includes a second, secondary switching transistor circuit 114 operating to couple the second secondary winding S2 of the transformer T to the negative node −V1 of the first DC bus and to the negative node −V2 of the second DC bus. The transistor switches 114 are also arranged in a full bridge configuration, where two respective pairs of high-side and low-side electronic switches, each with an anti-parallel diode thereacross, are coupled across the −V1, −V2 nodes. The respective intermediate nodes of each pair of switches are coupled to each end of the second secondary side winding S2. The additional voltage ΔV/2 is produced across the full bridge switching circuit 114, and thus −V2=−V1−ΔV/2.

The control circuit operates in accordance with a switching technique in order to open and close the various transistor switches within the primary, first secondary, and second secondary switching circuits 110, 112, 114 in order to produce +V1, −V1, +ΔV/2, −ΔV/2, −V2, and +V2. The control circuit drive the transistor switches of the circuits 110, 112, 114 to convert the DC voltage of the first and second busses into AC signals for application to the autotransformer T, and then to rectify such AC signals back to DC. The switches are preferably implemented by way of MOSFETs operating as synchronous rectifiers, so that the switches provide current flow in forward and reverse directions, and the bi-directional functionality of the autotransformer can be realized with DC inputs and outputs.

In a preferred arrangement, the switches are driven with a fixed, almost 50% duty cycle by the control circuit. There is no regulation of either the voltage or the current required. Instead, the dead time of the switches is limited to the time it takes for the bridge legs to losslessly transition to the next state by resonating the output capacitance of the switches (which capacitance is inherent in MOSFET switches). This lossless transition allows for a high switching frequency, such as about 100 kHz, substantially reducing the size of the transformer T. The switches and the transformer T need only be rated for the amount of boost/buck, for example 10%, of the processed power.

Figure 6A:
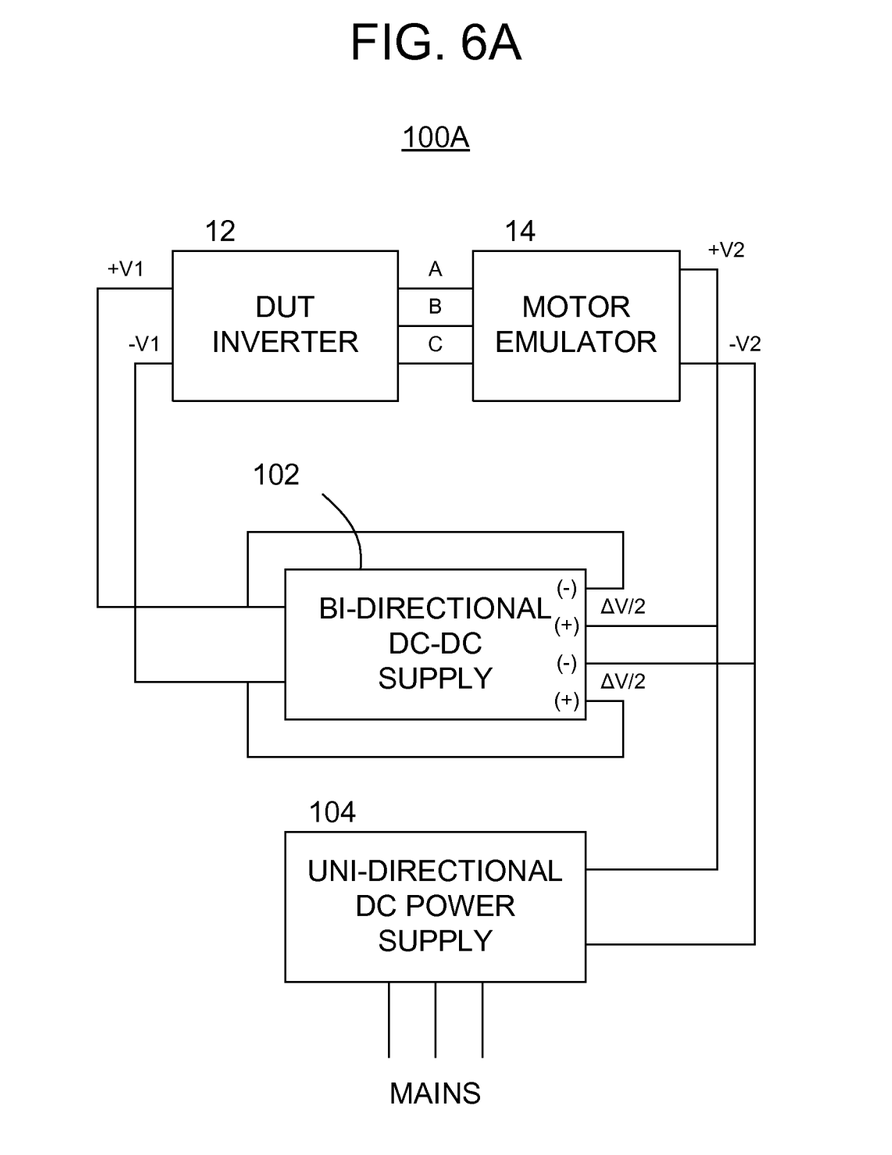
FIGS. 6A-6C are block diagrams of alternative systems for loading the motor drive inverter (under test) with a motor emulating inverter, where the systems employ varying configurations of certain power converters, while maintaining desired system operation.
Figure 6B:
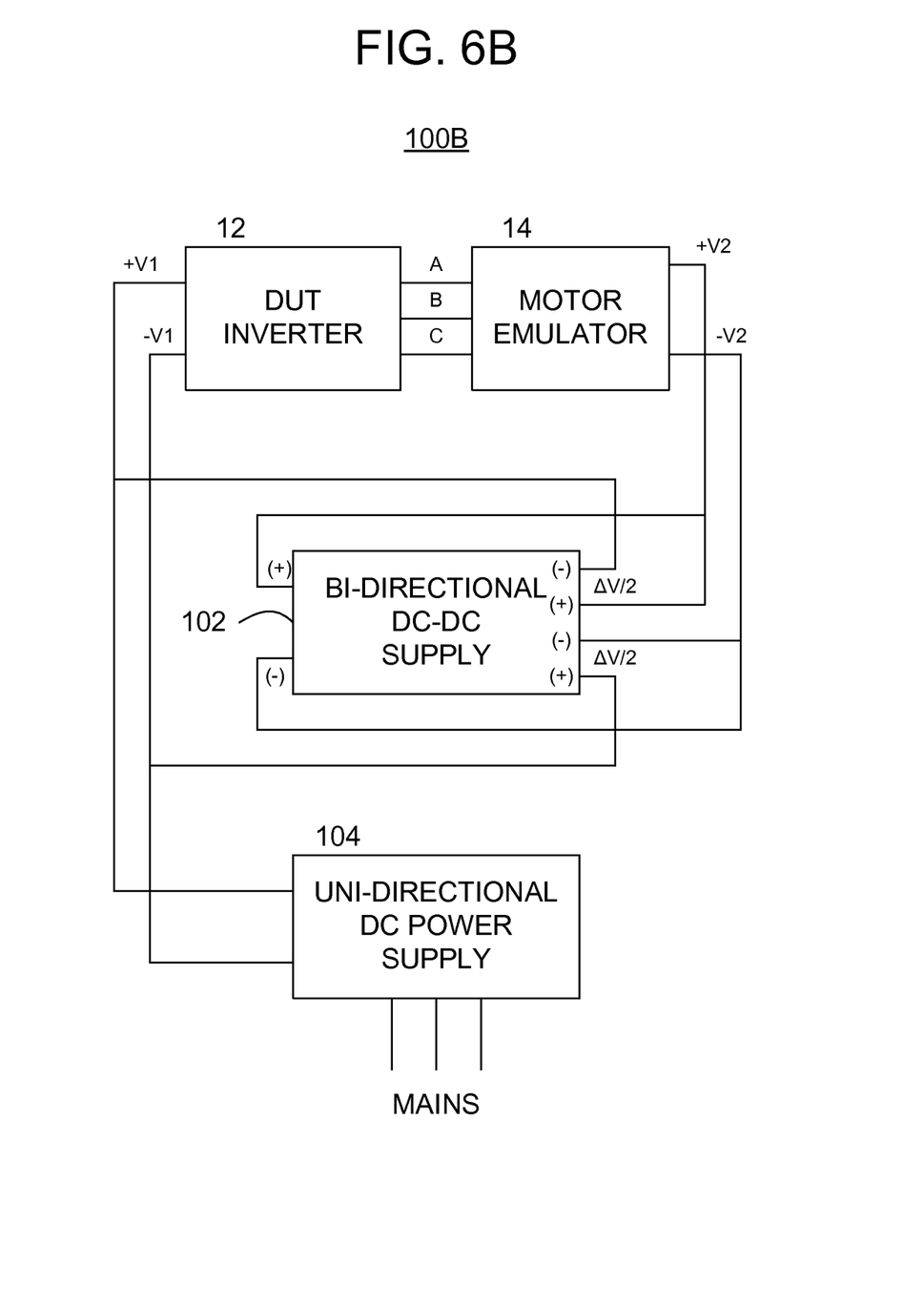
Figure 6C:
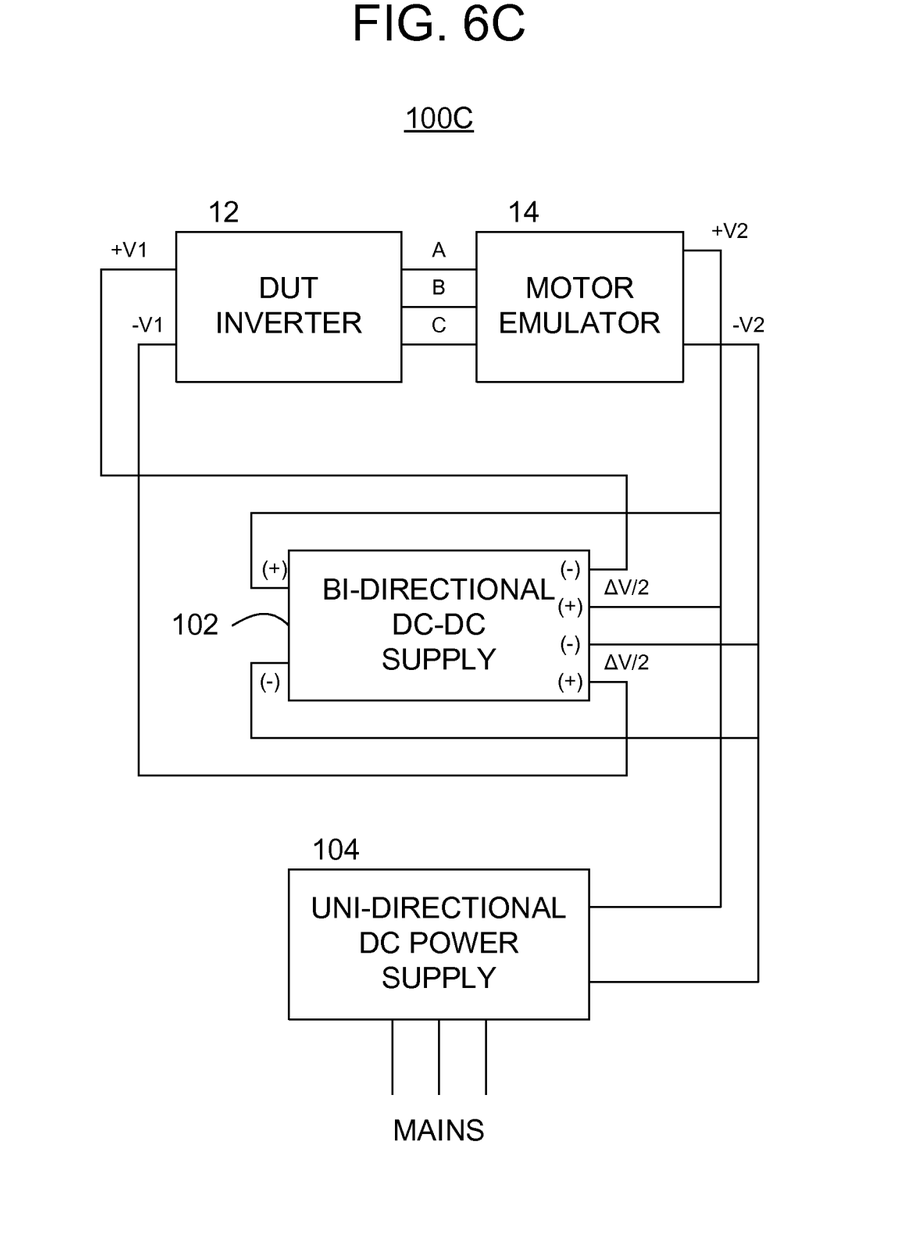

Reference is now made to FIGS. 6A, 6B, and 6C, which are block diagrams of alternative systems for loading the DUT inverter 12 with the motor emulator 14, where the systems employ varying configurations of certain of the power converters, while maintaining desired system operation. In particular, FIG. 6A illustrates a system 100A in which the further DC power supply 104 is coupled between the MAINS and the second DC bus (not the first DC bus as in FIG. 3). The DC power supply 104 operates to produce voltage at the second DC voltage potential and to control the voltage on that bus. The further DC power supply 104 still operates in this new configuration to provide power to offset the power conversion losses in the DUT inverter 12, the motor emulator 14, and the bi-directional DC-DC supply 102. The bi-directional DC-DC supply 102 is connected in the same manner as in FIGS. 3, 4, and 5.

FIG. 6B illustrates a system 100B in which the further DC power supply 104 is again coupled between the MAINS and the first DC bus, however, the bi-directional DC-DC supply 102 is connected in a different manner as compared with other embodiments. In this configuration, the primary winding P of the transformer T is coupled to the positive and negative nodes of the second DC bus (+/−V2). In particular, the transistor switches of primary switching circuit 110 are coupled across the +/−V2 nodes, and the respective intermediate nodes of each pair of switches are coupled to each end of the primary side winding P. The first, secondary switching transistor circuit 112 of the DC autotransformer circuit operates to couple the first secondary winding S1 of the transformer T to the positive node +V1 of the first DC bus and to the positive node +V2 of the second DC bus. The transistor switches of the circuit 112 are coupled across the +V1, +V2 nodes, with the respective intermediate nodes of each pair of switches coupled to each end of the first secondary side winding S1. The additional voltage ΔV/2 is produced across the full bridge switching circuit 112, and thus +V2=+V1+ΔV/2. The second, secondary switching transistor circuit 114 of the DC autotransformer circuit couples the second secondary winding S2 of the transformer T to the negative node −V1 of the first DC bus and to the negative node −V2 of the second DC bus. The transistor switches of the circuit 114 are coupled across the −V1, −V2 nodes, with the respective intermediate nodes of each pair of switches being coupled to each end of the second secondary side winding S2. The additional voltage ΔV/2 is produced across the full bridge switching circuit 114, and thus −V2=−V1−ΔV/2.

FIG. 6C illustrates a system 100C in which the further DC power supply 104 is again coupled between the MAINS and the second DC bus, and with the bi-directional DC-DC supply 102 connected as described in the configuration of FIG. 6B.

Figure 7:
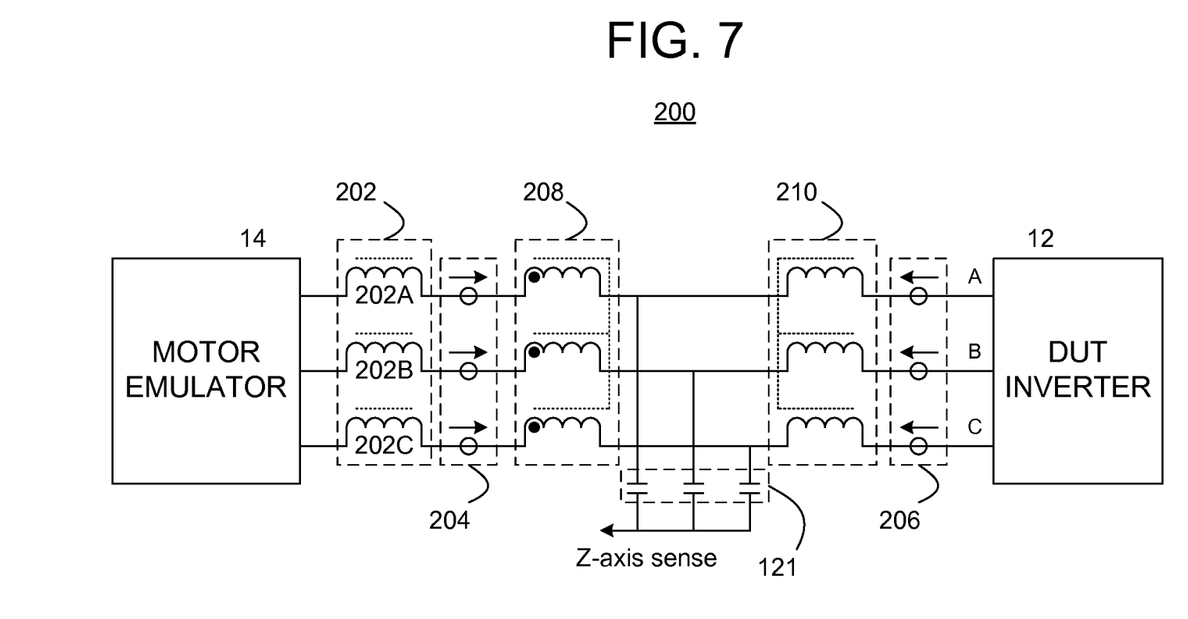
FIG. 7 is a circuit diagram of a preferred circuit network for interconnecting the DUT inverter and the motor emulator of FIG. 3 in accordance with one or more embodiments of the present invention.

Reference is now made to FIG. 7, which is a circuit diagram of a preferred network 200 for emulating the inductance of a physical motor and interconnecting the DUT inverter 12 and the motor emulator 14. The advantage of employing the network 200 is that it enables the motor emulator 14 to sense the commutation of the switching transistors in the DUT inverter 12 before the current in the inductors begins to ramp up. In other words, the network 200 permits a feed-forward voltage sense function that enables sensing of switching commutation in the DUT inverter 12. Without this network 200, one would be required to sense the ramping of current in the inductors only, which would result in an undesirable non-zero voltage across the inductors, and therefore a less effective emulation of a physical motor from the standpoint of the DUT inverter 12.

The network 200 includes a set of inductors 202A, 202B, 202C, each coupled in series from the motor emulator 14 toward the nodes A, B, C, of the DUT inverter 12. Current sensing is achieved at each such inductor via a respective current sensing element within circuit 204. Current is also sensed in each of the phase nodes A, B, C, at the output of the DUT inverter 12 by way of respective current sensing elements within circuit 206. A set of common mode chokes 208 are coupled in series with the inductors 202, and in series with a set of differential mode inductors 210. By separating the common mode chokes and differential mode inductances, an emulation of the BEMF is obtained therebetween. A set of integrating capacitors 212, arranged in a Y configuration produces a Z-axis voltage sense, which is an emulation of the common mode voltage of the DUT inverter 12. While the common mode voltage of the DUT inverter 12 exists within the inverter itself, such is not usually provided by way of terminals outside of the inverter 12. In accordance with the functionality of the network 200, however, such common mode voltage is emulated outside of the DUT inverter 12 and is available to the motor emulator 14 control circuitry to provide information as to switch commutation within the DUT inverter 12 without waiting for current to ramp up in the inductors.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:
1. An apparatus, comprising:
    a first DC bus operating to support a first DC voltage potential and for connecting to a DC input of a motor driver inverter circuit;
    a motor emulator circuit operating to emulate a polyphase motor and including polyphase output terminals for connecting to a polyphase output of the motor driver inverter circuit;
    a second DC bus operating to support a second DC voltage potential to a DC input of the motor emulator circuit; and
    a bi-directional DC-DC power supply coupled between the first and second DC busses, and operating to both: (i) add voltage potential to the first DC voltage potential to produce the higher, second DC voltage potential on the second DC bus, and (ii) subtract voltage potential from the second DC voltage potential to produce the lower, first DC voltage potential on the first DC bus.
2. The apparatus of claim 1, wherein at least one of:
    the bi-directional DC-DC power supply is rated at a fraction of a power rating of the motor emulator circuit;
    the bi-directional DC-DC power supply is rated at less than about 50% of the power rating of the motor emulator circuit; and
    the bi-directional DC-DC power supply is rated at about 10% or less of the power rating of the motor emulator circuit.

3. The apparatus of claim 1, wherein:
the bi-directional DC-DC power supply operates to add the voltage potential ($\Delta V$) to the first DC voltage potential (V1) to the second DC voltage potential; and
the bi-directional DC-DC power supply is rated at about $100\times(\Delta V/V1)$ percent of a power rating of the motor emulator circuit.

4. The apparatus of claim 1, wherein:
the first DC bus includes a positive node (+V1) and a negative node (–V1), each with reference to a reference potential, and each of nodes +V1 and –V1 exhibiting the same magnitude;
the second DC bus includes a positive node (+V2) and a negative node (–V2), each with reference to the reference potential, and each of nodes +V2 and –V2 exhibiting the same voltage magnitude;
the bi-directional DC-DC power supply adds a positive voltage potential (+$\Delta V$/2) to the positive node +V1 to produce the voltage on the positive node +V2; and
the bi-directional DC-DC power supply adds a negative voltage potential (–$\Delta V$/2) to the negative node –V1 to produce the voltage on the negative node –V2.

5. The apparatus of claim 4, wherein the bi-directional DC-DC power supply is rated at $100\times(+\Delta V/2-(-\Delta V/2))/(+V2-(-V2))$ percent of a power rating of the motor emulator circuit.

6. The apparatus of claim 4, wherein the bi-directional DC-DC power supply includes a DC autotransformer circuit to produce +V1, –V1, +$\Delta V$/2, –$\Delta V$/2, –V2, and +V2.

7. The apparatus of claim 6, wherein the DC autotransformer circuit includes:
a transformer including a primary winding of M×N turns, a first secondary winding of N turns, and a second secondary winding of N turns, where N and M×N are integers;
a primary switching transistor circuit operating to couple the primary winding of the transformer to the positive and negative nodes of the first DC bus;
a first, secondary switching transistor circuit operating to couple the first secondary winding of the transformer to the positive node of the first DC bus and to the positive node of the second DC bus;
a second, secondary switching transistor circuit operating to couple the second secondary winding of the transformer to the negative node of the first DC bus and to the negative node of the second DC bus; and
a controller operating to open and close transistor switches within the primary, first secondary, and second secondary switching circuits in order to produce +V1, –V1, +$\Delta V$, –$\Delta V$, –V2, and +V2.

8. The apparatus of claim 1, further comprising a DC power supply coupled between a main source of power and one of:
the first DC bus, where the DC power supply operates to produce voltage at the first DC voltage potential and provide power to offset power conversion losses in the motor driver inverter circuit, the motor emulator circuit, and the bi-directional DC-DC power supply; and
the second DC bus, where the DC power supply operates to produce voltage at the second DC voltage potential and provide power to offset power conversion losses in the motor driver inverter circuit, the motor emulator circuit, and the bi-directional DC-DC power supply.

9. The apparatus of claim 8, wherein the DC power supply is a uni-directional DC power supply operating only to source power.

10. The apparatus of claim 8, wherein at least one of:
the DC power supply is rated at a fraction of a power rating of the motor emulator circuit;
the DC power supply is rated at less than about 50% of the power rating of the motor emulator circuit; and
the DC power supply is rated at about 10% or less of the power rating of the motor emulator circuit.

11. The apparatus of claim 1, further comprising:
a differential mode inductor, including first, second and third windings wound in a differential mode configuration; and
a common mode inductor, including first, second and third windings wound in a common mode configuration, wherein:
the respective first, second, and third windings of the differential mode inductor are coupled in series with the first, second, and third windings of the common mode inductor, and
the respective pairs of series coupled windings of the differential mode inductor and the common mode inductor are coupled between the respective polyphase terminals of the motor emulator circuit and the motor driver inverter circuit.

12. The apparatus of claim 11, further comprising:
a capacitor network coupled in a Y configuration from the respective junctions of the respective pairs of series coupled windings of the differential mode inductor and the common mode inductor,
wherein a voltage at a common node of the capacitor network is an emulation of a Z-axis voltage, which is a common mode voltage, of the motor driver inverter circuit.

13. The apparatus of claim 12, wherein the motor emulator circuit operates to commutate internal switching transistors thereof based on the emulated Z-axis voltage.

14. A method, comprising:
emulating a polyphase motor using an emulation inverter circuit operating under the control of a pulse width modulation circuit, the emulation inverter circuit including: (i) polyphase output terminals for connecting to a polyphase output of a motor driver inverter circuit, and (ii) a DC input;
subtracting a voltage potential ($\Delta V$) from the DC input of the emulation inverter circuit to produce a DC input for the motor driver inverter circuit; and
adding the voltage potential ($\Delta V$) to the DC input of the motor driver inverter circuit to produce the DC input for the emulation inverter circuit.

15. The method of claim 14, wherein:
the DC input of the motor driver inverter circuit includes a positive node (+V1) and a negative node (–V1), each with reference to a reference potential, and each of nodes +V1 and –V1 exhibiting the same magnitude; and
the DC input of the emulation inverter circuit includes a positive node (+V2) and a negative node (–V2), each with reference to the reference potential, and each of nodes +V2 and –V2 exhibiting the same voltage magnitude.

16. The method of claim 15, further comprising:
adding a positive voltage potential (+$\Delta V$) to the positive node +V1 to produce the voltage on the positive node +V2; and
adding a negative voltage potential (–$\Delta V$) to the negative node –V1 to produce the voltage on the negative node –V2.

17. The method of claim 15, further comprising:
adding a negative voltage potential ($-\Delta V$) to the positive node +V2 to produce the voltage on the positive node +V1; and
adding a positive voltage potential ($+\Delta V$) to the negative node −V2 to produce the voltage on the negative node −V1.

18. The method of claim 14, further comprising offsetting power conversion losses in at least the motor driver inverter circuit and the emulator inverter circuit using a DC power supply coupled from a main source of power to the DC input of the motor driver inverter circuit.

* * * * *